United States Patent [19]
Guntzburger et al.

[11] Patent Number: 5,398,006
[45] Date of Patent: Mar. 14, 1995

[54] METHOD AND APPARATUS FOR AUTOMATIC LOOP CONTROL

[75] Inventors: Philippe Guntzburger, Strasbourg; Jean-Yves Moraillon, Wolxheim; Claude Rambault, Ostwald, all of France

[73] Assignee: Thomson Consumer Electronics, S.A., Courvevoie, France

[21] Appl. No.: 31,360

[22] Filed: Mar. 15, 1993

[30] Foreign Application Priority Data

Mar. 18, 1992 [EP] European Pat. Off. ............ 92400735

[51] Int. Cl.⁶ .................................................. H03L 7/00
[52] U.S. Cl. ........................................ 331/1 A; 331/17
[58] Field of Search .................. 331/1, 1 A, 17, 16, 331/25, 34, 8

[56] References Cited

U.S. PATENT DOCUMENTS

| | | | |
|---|---|---|---|
| 3,675,146 | 7/1972 | Langham | 331/1 R |
| 3,753,142 | 8/1973 | Nardin et al. | 331/1 A |
| 3,927,384 | 12/1975 | Jezo | 331/2 |
| 4,123,724 | 10/1978 | Das et al. | 331/1 A |
| 4,301,423 | 11/1981 | Mulder | 331/1 R |
| 4,378,509 | 3/1983 | Hatchett et al. | 331/1 A |
| 4,667,168 | 5/1987 | Shiomi et al. | 331/1 R |
| 4,689,581 | 8/1987 | Talbot | 331/1 A |
| 4,994,762 | 2/1991 | Tay | 331/2 |
| 5,038,115 | 8/1991 | Myers et al. | 331/2 |
| 5,142,247 | 8/1992 | Lada, Jr. et al. | 331/14 |

FOREIGN PATENT DOCUMENTS 0112599 7/1984 European Pat. Off. ........ H03L 7/08

Primary Examiner—Raymond A. Nelli
Attorney, Agent, or Firm—Joseph S. Tripoli; Joseph J. Laks; Sammy S. Henig

[57] ABSTRACT

A method of automatically controlling a loop comprising the steps of applying an input signal and an error correction signal to a signal correction circuit to provide a digital corrected signal. Applying the digital corrected signal and a reference signal to an error measurement circuit and providing a difference signal representative of the difference between the corrected signal and the reference signal. Applying the difference signal to a tri-state buffer having an output which is switchable to high impedance and passing the error correction signal to a correction circuit through an integrator and a local generator circuit. The buffer is switched to high impedance when the difference between the error correction signal and the reference signal is zero.

10 Claims, 2 Drawing Sheets

METHOD AND APPARATUS FOR AUTOMATIC LOOP CONTROL

The present invention relates to a method and to an apparatus for automatic loop control.

BACKGROUND

An automatic loop control can be done in two ways:

The first solution, used for instance in PLL (Phase Locked Loop) applications, is a loop control signal issued from an edges sensitive phase comparator with tri-state output levels. This kind of phase comparator works according to the principle shown in FIG. 1. At each cycle of the reference frequency 12 and 22 the phase comparator output 13 and 23 goes to high level 15 or low level 25 (depending on the sign of the phase difference) during a time which is proportional to the phase difference between measuring input 11 and 21 and reference input. In FIG. 1a the measuring input is in advance versus the reference input and in FIG. 1b vice versa.

Within the loop control an external capacitor is charged or discharged via a resistor yielding a low pass filter. When the phase comparator output is High-Z (high-impedance) the respective control voltage is memorised in this capacitor. This is equivalent to an integrator function because the static phase error is equal to zero. The behaviour of such a system is good when the phase comparator works continuously. If the phase comparison is done e.g. only once per video line, the response time must be very long for stability reasons. But then the response to a phase step is worse.

The second solution provides a control signal proportional to a measured error. In case of digital error measurement, a digital to analog conversion function is required. This can be achieved by using for instance a DAC (D/A Converter) or a PWM (Pulse Width Modulation) or a PDM (Pulse Density Modulation). The drawback of such a solution is the lack of the integrator function. Consequently a static phase error exists for a PLL.

INVENTION

It is one object of the invention to disclose a method for improved automatic loop control which combines advantages of the known methods. This object is reached by the inventive method disclosed in claim 1.

The invention combines a tri-state buffer with levels switched at PDM rate providing a smooth loop control signal. If the phase difference is less than a given value called dead-zone value, the buffer stays in a high-impedance state.

The static error issued from a digital error measurement is zero. Therefore the DC loop gain can be infinite.

The invention provides in case of a PLL the same loop behaviour as the first above mentioned solution when used with a phase comparator providing a digital control word representing the phase error $\epsilon_d$(digital). A non-linearity of the error measurement can be compensated or created by the PDM function.

In principle the inventive method consists in an automatic loop control, wherein an input signal (301) is corrected by correction means (AD) and an error between the respective output signal (303) and a reference (304) is evaluated to control via local signal generator means (LSG) said correction means, wherein said error ($\epsilon_d$) is measured in digital form and used to control buffer means (TB) the output of which can be switched to a high impedance and is passed through integrating means (EF) to said local signal generator means, wherein said switching is caused by a PDM function.

Advantageous additional embodiments of the inventive method are resulting from the respective dependent claims.

It is a further object of the invention to disclose an apparatus which utilizes the inventive method. This object is reached by the inventive apparatus disclosed in claim 9.

In principle the inventive apparatus comprises correction means (AD) for an input signal (301) and error measurement means (EM) for measuring an error between the respective output signal (303) of said correction means and a reference (304), wherein said error ($\epsilon_d$) is measured in digital form and used to control buffer means (TB) the output of which can be switched to a high impedance and is passed through integrating means (EF) to local signal generator means (LSG) which control said correction means, wherein said switching is caused by PDM means (PDM).

Advantageous additional embodiments of the inventive apparatus are resulting from the respective dependent claim.

DRAWINGS

Preferred embodiments of the invention are described with reference to the accompanying drawings, in which.

PREFERRED EMBODIMENTS

Figure 1A:
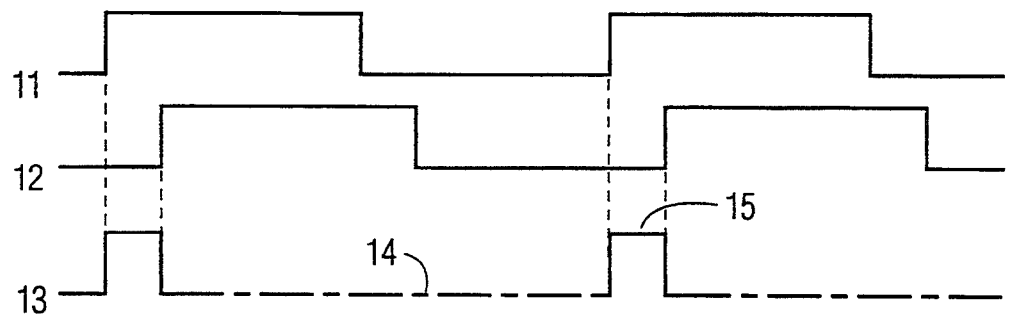
FIGS. 1A & 1B show the principle of known phase comparators.
Figure 1B:
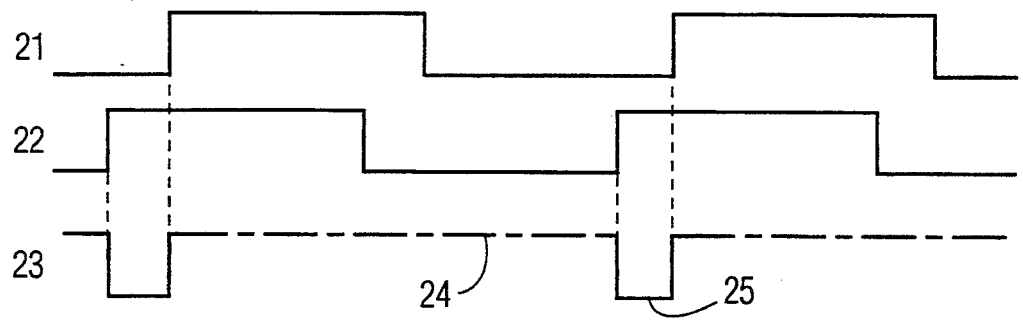
Figure 2:
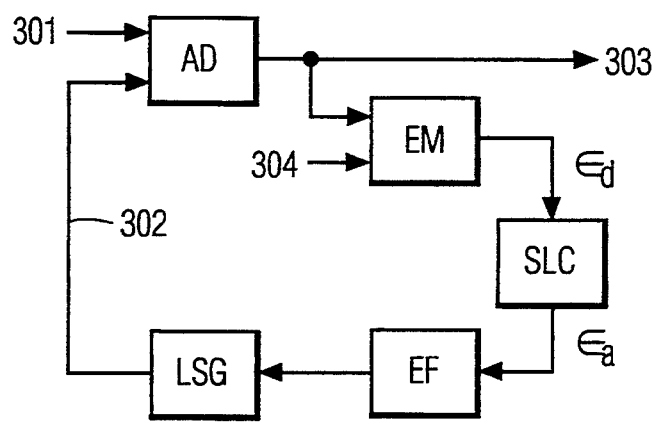
FIG. 2 shows an automatically controlled loop with the inventive smooth loop control.

In FIG. 2 an input signal 301, e.g. a transmitted TV signal, is fed to an input signal correction circuit AD which may also comprise an A/D converter for the input signal and which delivers the output signal 303. From this output signal and from a reference 304 an error measurement circuit EM forms digital error words $\epsilon_d$. The reference 304 may comprise e.g. a reference voltage, a reference frequency and/or the input signal 301 and/or the output signal 303, if the reference is contained in this signal 303, as is the case e.g. for a PLL in a MAC TV system. The digital error words are converted in a loop control circuit SLC to respective analog error values $\epsilon_a$ which load an RC filter EF (externally connected to a respective pin of an IC). The loop control circuit SLC works as described for FIG. 3. A local signal generator LSG receives the filtered analog error values and controls correction circuit AD accordingly.

In case of a PLL the local signal generator LSG is a VCO or VCXO providing the sampling clock of an A/D converter AD. The error measurement is the result of a phase comparator.

Figure 3:
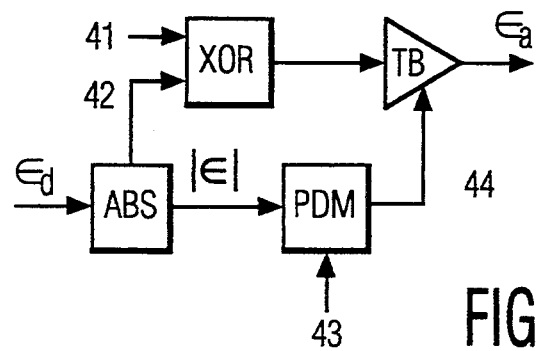
FIG. 3 depicts how a loop control signal is received from a digital error measurement.

In FIG. 3 digital error words $\epsilon_d$ are fed to an absolute value circuit ABS which outputs sign and absolute value of the error. The sign 42 of error $\epsilon$ can be inverted by means of a polarity flag 41 in an exclusive OR gate XOR and is used as data input for a tri-state buffer TB.

Thus control can be easily inverted depending on loop characteristics. The absolute value of error $\epsilon$ is evaluated in a pulse density modulation circuit PDM which controls with its output signal 44 tri-state buffer TB. If e.g. signal 44 is zero, buffer TB has a high output impedance which allows to keep for a certain time, e.g. during the active period of a TV line, the analog value stored in filter EF. A dead-zone value (DZV) 43 fed to pulse density modulation circuit PDM allows to loosen up the loop reaction on error $\epsilon$ to a certain amount, i.e. to introduce a hysteresis. When DZV equals zero, only the PDM converted error $\epsilon$ is acting on output signal 44.

PDM (pulse density modulation) is a PWM (pulse width modulation) with an inverted bus from a counter to a comparator yielding regularly spaced pulses over the whole counting period. The counter clock must be higher in frequency than $\epsilon_d$ updates in such a way that at least one whole counter cycle can be performed between each $\epsilon_d$ update.

Figure 4:
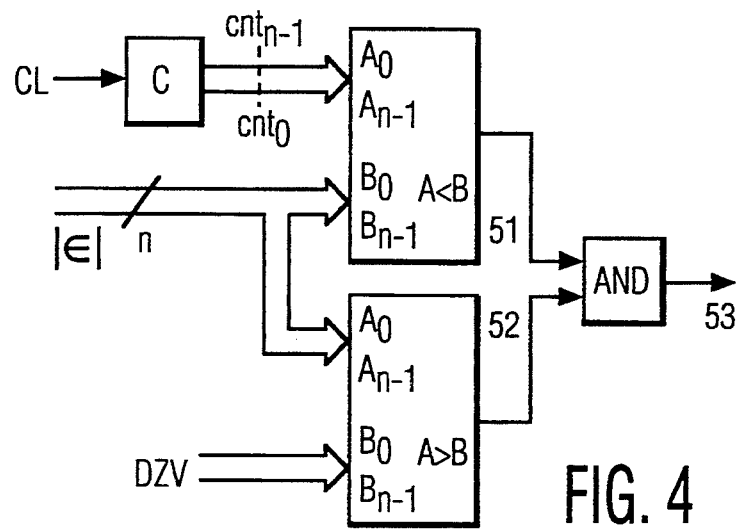
FIG. 4 shows a first PDM implementation.
Figure 5:
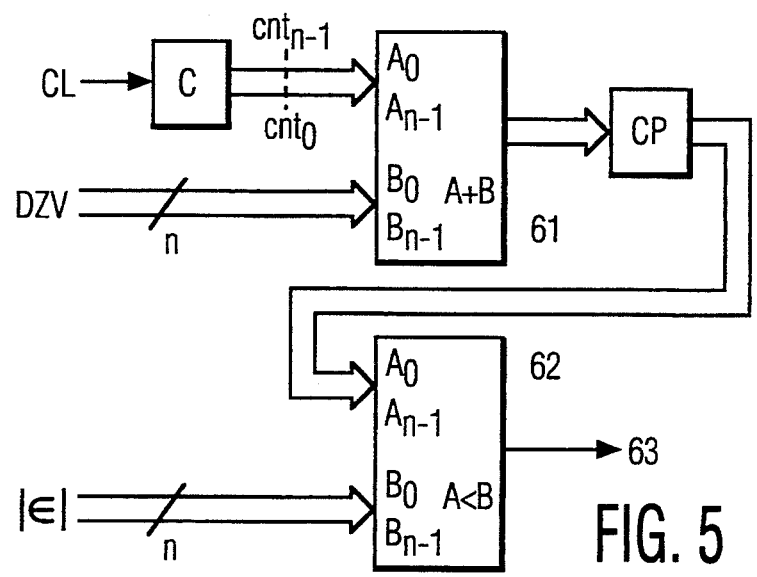
FIG. 5 shows a second PDM implementation.

FIG. 4 and FIG. 5 show two different embodiments for the pulse density modulation circuit PDM of FIG. 3. In FIG. 4 a clock CL is counted with a n bit counter C, e.g. starting at the beginning of a TV line. The n bits $cnt_0 \ldots cnt_{n-1}$ of the counter output are twisted with respect to the n bit input $A_0 \ldots A_{n-1}$ of a comparator 51. Advantageously this results in a higher pulse frequency and the time constant of the integrator function can be shortened, if all $2^n$ output values of counter C are scanned during each counter cycle. The second n bit input B of comparator 51 receives the absolute value of error $\epsilon$ which is also fed to input A of a second n bit comparator 52. An error of n LSB will provide n pulses during one counter cycle in a linear way. Input B of comparator 52 receives the dead-zone value DZV. Counter C and comparator 51 represent a PDM function. The dead-zone value and the PDM signals are mixed in an AND gate providing the impedance control signal 44 for the tri-state buffer TB. If $\{\epsilon\}$ is equal or less than DZV, the buffer output is switched to high impedance. If $\{\epsilon\}$ is greater than DZV, the buffer output is switching at PDM rate between sign of error (or inverted if polarity 41='1') and high impedance; the number of pulses is equal to $\{\epsilon\}$.

In FIG. 5, also, a clock CL is counted with a n bit counter C. The n bits of the counter output are twisted accordingly with respect to the n bit input A of a comparator 61. The second n bit input B of an adder 61 receives the dead-zone value DZV. The output of this adder is limited in a clipping circuit CP in case of overflow of the n bit range. The output of this clipping circuit and error $\epsilon$ are compared in a comparator 62. Only an error of DZV+n LSB will provide n output pulses 63 during one counter cycle.

The reaction speed of the loop can be easily modulated versus amplitude of error $\epsilon$ due to a digitally encoded error value. This modulation can be modified by adding a look-up table or any other feature such that the PDM function has an offset or a non-unity gain or a non-linear function or a combination of these characteristics. This function must be chosen in order to fulfil stability criteria knowing that the RC filter in combination with the buffer's high impedance level is equivalent to an integrator. Almost the whole process is purely digital. A D/A converter function is performed by the PDM, the pulses are filtered by the RC filter which behaves as memory when the output of buffer TB is switched to high impedance. This means that the invention can be used for automatic loop control with infinite DC loop gain (static error is equal to zero). The automatic loop control can be easily integrated in a purely digital IC.

The invention can be applied for any automatic controlled loop having a digital error measurement result. e.g.:
  clamp (DC level regeneration);
  AGC (automatic gain control);
  PLL (clock regeneration).

The invention can be used in receivers using TV signals or other equipment for e.g.:
  digitally transmitted TV, advanced TV standards;
  MAC family including HDMAC, MUSE;
  HDTV;
  PAL, SECAM, NTSC with digital features.

We claim:

1. A method of automatically controlling a feedback loop comprising the steps of:
  applying an input signal and an error correction signal to a signal correction circuit and providing a corrected signal;
  applying said corrected signal and a reference signal to an error measurement circuit and providing an error signal representative of a difference between said corrected signal and said reference signal;
  applying said error signal to a pulse density modulator; and
  applying an output of said modulator to said correction circuit through an integrator and a local generator circuit to produce said error correction signal that is applied to said signal correction circuit.

2. The method of claim 1 further including the step of using an absolute value of said error signal to pulse density modulate a signal that is applied via a tri-state buffer to said integrator and using a sign of said error signal as an input to said buffer.

3. The method of claim 2 wherein said input signal is a television signal and further including the step of measuring an error one time per television line to produce said error signal.

4. An apparatus for controlling a feedback loop, comprising:
  a source of an input signal;
  a signal correction circuit responsive to said input signal and to an error correction signal for generating a corrected signal;
  an error measurement circuit responsive to said corrected signal and to a reference signal for generating an error signal in accordance with a difference therebetween;
  a pulse density modulator responsive to said error signal;
  a local generator circuit; and
  an integrator for applying an output signal of said modulator to said local generator circuit to generate said error correction signal that is coupled to said signal correction circuit.

5. An apparatus according to claim 4 wherein said modulator comprises a counter which is coupled via a twisted bus to a comparator.

6. The method according to claim 1 wherein a twisted bus is used in said pulse density modulator.

7. The method according to claim 1 wherein said output of said modulator is determined in accordance with a dead-zone value.

8. The method according to claim 1 wherein said output of said modulator includes one of an offset, a non-unity gain and a non-linear functions.

9. A method according to claim 1 wherein said corrected signal is a digital signal.

10. An apparatus according to claim 4 wherein said corrected signal is a digital signal.

* * * * *